(12) United States Patent
Wu et al.

(10) Patent No.: US 11,778,845 B2
(45) Date of Patent: Oct. 3, 2023

(54) PIXEL ARRAY PACKAGE STRUCTURE AND DISPLAY PANEL

(71) Applicant: Lextar Electronics Corporation, Hsinchu (TW)

(72) Inventors: Hui-Ru Wu, Hsinchu (TW); Jian-Chin Liang, Hsinchu (TW); Jo-Hsiang Chen, Hsinchu (TW); Lung-Kuan Lai, Hsinchu (TW); Cheng-Yu Tsai, Hsinchu (TW); Hsin-Lun Su, Hsinchu (TW); Ting-Kai Chen, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 17/663,431

(22) Filed: May 15, 2022

(65) Prior Publication Data

US 2022/0271251 A1    Aug. 25, 2022

Related U.S. Application Data

(62) Division of application No. 16/232,041, filed on Dec. 25, 2018, now Pat. No. 11,367,849.

(30) Foreign Application Priority Data

Aug. 22, 2018 (TW) ................. 107129351

(51) Int. Cl.
*H10K 50/125* (2023.01)
*H01L 33/60* (2010.01)
(Continued)

(52) U.S. Cl.
CPC ........... *H10K 50/125* (2023.02); *H01L 33/60* (2013.01); *H10K 50/856* (2023.02); *H10K 50/865* (2023.02); *H10K 50/868* (2023.02)

(58) Field of Classification Search
CPC ............. H01L 51/5036; H01L 51/5271; H01L 51/5284; H01L 51/5293; H01L 25/0753;
(Continued)

(56) References Cited

U.S. PATENT DOCUMENTS 8,974,090 B2    3/2015 Ou
10,066,821 B1 *  9/2018 Chung ................ H01L 25/0753
(Continued)

FOREIGN PATENT DOCUMENTS

CN    101853877 A    10/2010
EP     2216840 B1     4/2013
(Continued)

*Primary Examiner* — Natalia A Gondarenko
(74) *Attorney, Agent, or Firm* — CKC & Partners Co., LLC (57) ABSTRACT

A pixel array package structure includes: a substrate; a pixel array disposed on the substrate, in which the pixel array includes a plurality of light emitting diode chips, and the light emitting diode chips include at least one red diode chip, at least one green diode chip, at least one blue diode chip, and a combination thereof; a reflective layer disposed on the substrate and between any two adjacent of the light emitting diode chips; a light-absorbing layer disposed on the reflective layer and surrounding the pixel array; and a light-transmitting layer disposed on the pixel array, the reflective layer, and the light-absorbing layer, in which the light-transmitting layer has an upper surface and a lower surface opposite thereto, and the lower surface is in contact with the pixel array, and the upper surface has a roughness of 0.005 mm to 0.1 mm.

10 Claims, 12 Drawing Sheets

(51) Int. Cl.
*H10K 50/856* (2023.01)
*H10K 50/86* (2023.01)
*H10K 50/80* (2023.01)

(58) Field of Classification Search
CPC ... H01L 25/167; H01L 23/5386; H01L 33/44; H01L 33/46; H01L 33/502; H01L 33/58; H01L 33/60; H01L 33/507; H01L 33/505; H01L 33/52; H01L 33/54; H01L 33/56; H01L 33/62; H01L 33/007; H01L 33/0079; H01L 33/06; H01L 33/08; H01L 33/10; H01L 33/18; H01L 33/32; H01L 33/36; H01L 33/38; H01L 33/40; H01L 33/405; H01L 33/42; H01L 33/48; H01L 33/486; H01L 33/50; H01L 2933/0033; H01L 2933/005; H01L 2933/0066–0091; H01L 2933/0058; H01L 2933/0016; H01L 2933/0041; H01L 27/124; H01L 27/156; H01L 27/3239; H01L 27/0753; H10K 50/125; H10K 50/858; H10K 50/856; H10K 50/865; H10K 50/868; H10K 50/8426; H10K 50/8428; H10K 59/129; H10K 59/173; H10K 59/878; H10K 59/8792; H10K 59/8793
USPC .................................. 257/88, 89, 98, 99, 100
See application file for complete search history.

(56) References Cited

U.S. PATENT DOCUMENTS

| | | |
|---|---|---|
| 2009/0152573 A1 | 6/2009 | Loh et al. |
| 2012/0235169 A1 | 9/2012 | Seko et al. |
| 2014/0036508 A1 | 2/2014 | Ou |
| 2016/0190400 A1 | 6/2016 | Jung et al. |
| 2016/0329527 A1* | 11/2016 | Yang .................... G02B 5/3016 |
| 2018/0069162 A1 | 3/2018 | Abe et al. |
| 2018/0097159 A1 | 4/2018 | Teranishi et al. |
| 2018/0151543 A1 | 5/2018 | Lee |
| 2018/0342486 A1 | 11/2018 | Lee et al. |
| 2018/0371246 A1 | 12/2018 | Kuhn et al. |
| 2019/0189853 A1 | 6/2019 | Yoo et al. |
| 2019/0237638 A1 | 8/2019 | Andrews et al. |
| 2019/0244938 A1* | 8/2019 | Bang .................... H01L 25/0753 |
| 2019/0363223 A1 | 11/2019 | Murthy et al. |
| 2019/0371974 A1* | 12/2019 | Hussell .................. H01L 33/56 |

FOREIGN PATENT DOCUMENTS

| | | | | |
|---|---|---|---|---|
| EP | 3306683 A1 | | 4/2018 | |
| KR | 2464561 B1 | * | 11/2022 | ......... H01L 25/0753 |
| TW | 200631202 A | | 9/2006 | |
| TW | I576534 B | | 4/2017 | |

* cited by examiner

PIXEL ARRAY PACKAGE STRUCTURE AND DISPLAY PANEL

CROSS-REFERENCE TO RELATED APPLICATION

The present application is a Divisional Application of the U.S. application Ser. No. 16/232,041, filed Dec. 25, 2018, which claims priority to Taiwan Application Serial Number 107129351, filed Aug. 22, 2018, all of which are herein incorporated by their entireties.

BACKGROUND

Field of Invention

The present disclosure relates to a pixel array package structure and a display panel.

Description of Related Art

With rapid advancement of display technology, in addition to a conventional liquid crystal display panel, a display panel uses a RGB light emitting diode (RGB LED) as a display pixel and a light source. Since the LED has the advantage of low power consumption, the display panel using the LED can effectively save the power required by the conventional liquid crystal panel, which can help energy saving, carbon reduction and environmental protection, and thus is expected to become a new potential product in the display technology field. The RGB display cannot achieve small pitch operations due to process limitations of surface mounted devices packaging processes. However, current displays move toward development of chip on board packaging processes, such that sub-millimeter LEDs (mini LEDs) and micro LEDs can achieve small pitch operations.

In the technique of the three primary color display, in addition to the color vividness, there is an index that determines the sharpness of the screen, that is, the contrast. In the manner of increasing the contrast in a small pitch, in addition to using a black plate as the substrate, light-absorbing particles are added into the encapsulant. The light-absorbing particles can not only reduce the influence of the lateral light of the LED but also absorb the light source from outside to increase the contrast. However, it cause the problem of reduced light output of the forward light.

In addition, the current large-sized display panel splicing technology is to stack a plurality of small display panels with each other to form a large-sized display panel. Since there are gaps at the frame of the display panel and between the displays, there is a problem that the screen is cut and not continuous when the large-sized display panel displays, which affects the quality of the display. In order to improve the above problems, a display panel with a narrow frame has been developed to narrow the gaps between the displays during splicing. However, even if the display panel with the current narrowest frame is used, a certain safety distance should be retained to avoid damage caused by the mutual pressing of the display panels, so that the large-sized display panel still has splicing gaps.

SUMMARY

In view of the above, a purpose of the present disclosure is to provide a pixel array package structure and a display panel that can solve the above problems.

To achieve the above purpose, an aspect of the present disclosure provides a pixel array package structure including a substrate, a pixel array, a reflective layer, a light-absorbing layer, and a light-transmitting layer. The pixel array is disposed on the substrate. The pixel array includes a plurality of light emitting diode chips. The light emitting diode chips include at least one red diode chip, at least one green diode chip, at least one blue diode chip, and a combination thereof. The reflective layer is disposed on the substrate and between any two adjacent of the light emitting diode chips. The light-absorbing layer is disposed on the reflective layer and surrounds the pixel array. The light-transmitting layer is disposed on the pixel array, the reflective layer, and the light-absorbing layer. The light-transmitting layer has an upper surface and a lower surface opposite thereto. The lower surface is in contact with the pixel array, and the upper surface has a roughness of 0.005 mm to 0.1 mm.

According to one embodiment of the present disclosure, the pixel array package structure further includes an anti-external light material disposed on the light-transmitting layer.

According to one embodiment of the present disclosure, the anti-external light material is a polarizer.

According to one embodiment of the present disclosure, the reflective layer is composed of a mixture of a colloidal material and inorganic particles, in which the inorganic particles include titanium dioxide, boron nitride, silicon dioxide, barium sulfate or aluminum oxide.

According to one embodiment of the present disclosure, a lower surface of the light-absorbing layer is substantially coplanar with an upper surface of the pixel array.

According to one embodiment of the present disclosure, an upper surface of the light-absorbing layer is substantially coplanar with an upper surface of the pixel array.

According to one embodiment of the present disclosure, the light-absorbing layer is composed of a colloidal material and an inorganic material, or a colloidal material and an organic material.

According to one embodiment of the present disclosure, the inorganic material is carbon powder or perovskite.

According to one embodiment of the present disclosure, the carbon powder has a specific surface area of 50 $m^2/g$ to 70 $m^2/g$.

Another aspect of the present disclosure provides a pixel array package structure including a substrate, a pixel array, a reflective layer, a light-transmitting layer, and a light-absorbing layer. The pixel array is disposed on the substrate. The pixel array includes a plurality of light emitting diode chips. The light emitting diode chips include at least one red diode chip, at least one green diode chip, at least one blue diode chip, and a combination thereof. The reflective layer is disposed on the substrate and between any two adjacent of the light emitting diode chips. The light-transmitting layer is disposed on the pixel array. The light-transmitting layer has an upper surface and a lower surface opposite thereto. The lower surface is in contact with the pixel array, and the upper surface has a roughness of 0.005 mm to 0.1 mm. The light-absorbing layer is disposed on the reflective layer and surrounds the light transmitting layer. The upper surface of the light-transmitting layer is substantially coplanar with an upper surface of the light-absorbing layer.

According to one embodiment of the present disclosure, a lower surface of the light-absorbing layer is substantially coplanar with an upper surface of the pixel array.

According to one embodiment of the present disclosure, the light-absorbing layer is composed of a colloidal material and an inorganic material, or a colloidal material and an organic material.

According to one embodiment of the present disclosure, the inorganic material is carbon powder or perovskite.

According to one embodiment of the present disclosure, the carbon powder has a specific surface area of 50 m$^2$/g to 70 m$^2$/g.

According to one embodiment of the present disclosure, the light-transmitting layer covers a portion of the reflective layer.

A further aspect of the present disclosure provides a display panel including a plurality of sub-display panels. Any two adjacent of the sub-display panels has a splicing gap, in which each of the sub-display panels includes a plurality of the pixel array package structures described above.

It is to be understood that both the foregoing general description and the following detailed description are by examples, and are intended to provide further explanation of the present disclosure as claimed.

BRIEF DESCRIPTION OF THE DRAWINGS

The invention can be more fully understood by reading the following detailed description of the embodiment, with reference made to the accompanying drawings as follows.

DETAILED DESCRIPTION

The description of the embodiments of the present disclosure is intended to be illustrative and not restrictive. The embodiments disclosed in the following may be combined or substituted with each other in an advantageous situation, and other embodiments may be added to an embodiment without further description or explanation.

In the following description, numerous specific details will be described in detail in order to enable the reader to fully understand the following embodiments. However, embodiments of the present disclosure may be practiced without these specific details. In other instances, well-known structures and devices are only schematically illustrated in the drawings in order to simplify the drawings.

Figure 1A:
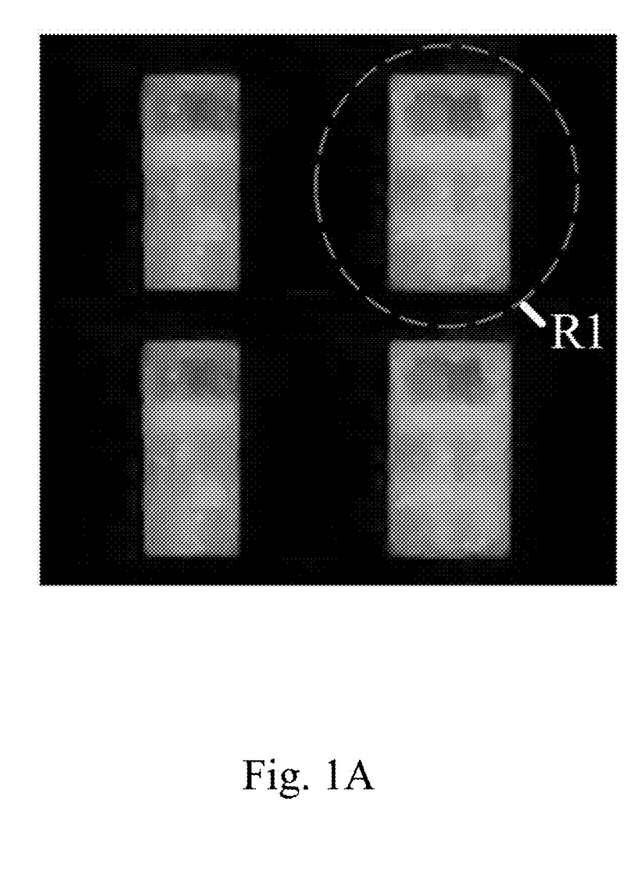
FIG. 1A is a microscopic top view of a pixel array package structure according to one embodiment of the present disclosure.
Figure 1B:
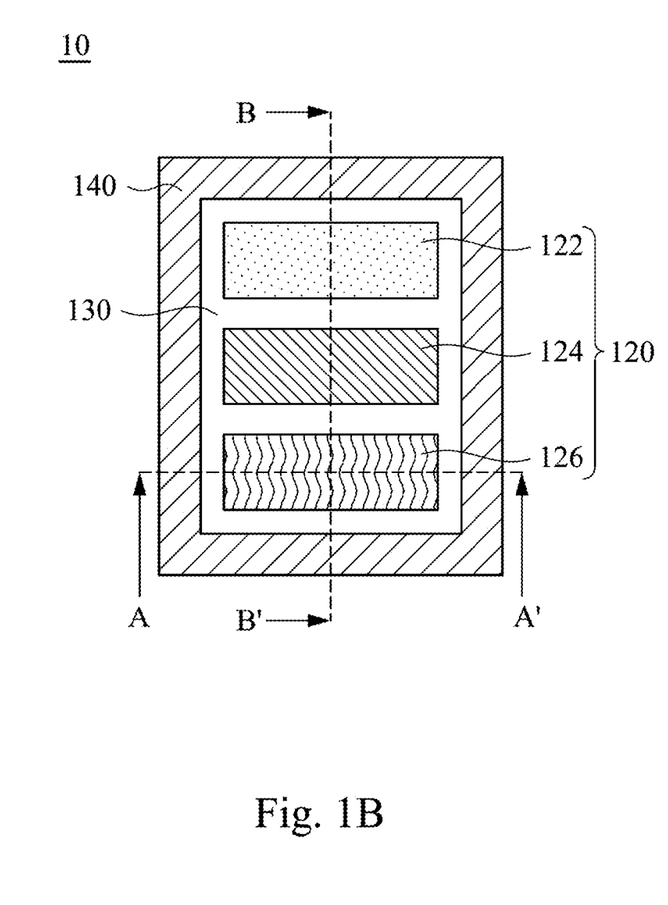
FIG. 1B is a partially enlarged schematic view of a region R1 of FIG. 1A.
Figure 1C:
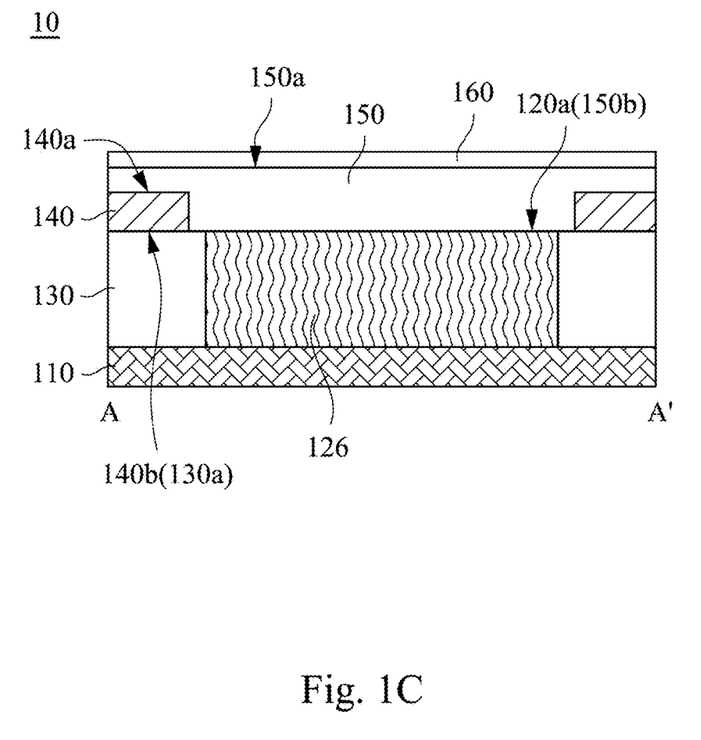
FIG. 1C and FIG. 1D are schematic cross-sectional views taken along line A-A' and line B-B' of FIG. 1B, respectively.
Figure 1D:
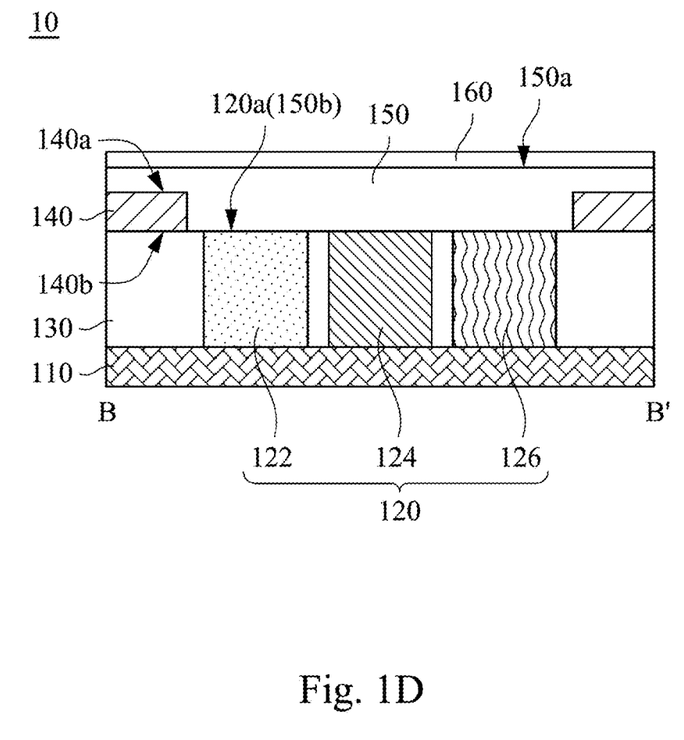

A purpose of the present disclosure is to provide a pixel array package structure. FIG. 1A is a microscopic top view of a pixel array package structure according to one embodiment of the present disclosure. FIG. 1B is a partially enlarged schematic view of a region R1 of FIG. 1A. FIG. 1C and FIG. 1D are schematic cross-sectional views taken along line A-A' and line B-B' of FIG. 1B, respectively.

Referring to FIG. 1B, FIG. 1C and FIG. 1D simultaneously, the pixel array package structure 10 includes a substrate 110, a pixel array 120, a reflective layer 130, a light-absorbing layer 140, and a light-transmitting layer 150. The pixel array 120 is disposed on the substrate 110. Specifically, the pixel array 120 includes a plurality of light emitting diode (LED) chips 122, 124, and 126. In various embodiments of the present disclosure, the substrate 110 may be a white substrate or a black substrate. In some embodiments, the substrate 110 may include a heat dissipation substrate, a conductive substrate, or an insulating substrate. In some embodiments, the substrate 110 has a circuit layer thereon, which is configured to electrically connect the LED chips 122, 124, and 126. These LED chips include at least one red LED chip 122, at least one green LED chip 124, at least one blue LED chip 126, and a combination thereof.

It can be understood that the red LED chip 122 emits red light. In some other embodiments, the red LED chip 122 may also include emitting red light by exciting a wavelength conversion layer (not shown) by blue light emitted by the blue LED chip 126. In various examples, the wavelength conversion layer can include one or more red phosphors, red quantum dots, or a mixture thereof. For example, the red phosphor material may include nitrides, fluorides and/or manganese (Mn$^{4+}$) doped fluoride phosphors, such as $A_2[MF_6]:Mn^{4+}$, in which A is Li$^+$, Na$^+$, K$^+$, Rb$^+$, Cs$^+$ and/or NH$_4^+$, and M is Ge, Si, Sn, Ti or Zr.

It can be understood that the green LED chip 124 emits green light. In some other embodiments, the green LED chip 124 may include emitting green light by exciting a wavelength conversion layer (not shown) by blue light emitted by the blue LED chip 126. In various examples, the wavelength conversion layer may include one or more green phosphors, green quantum dots, or a mixture thereof. For example, the green phosphor may be silicate, LuYAG, and/or B—SiAlON, and the green quantum dots may be CdSe, CdS, CdTe, SInP, InN, AlInN, InGaN, AlGaInN, and/or CuInGaSe. For another example, the green quantum dots may be green all-inorganic perovskite quantum dots having a chemical formula of $CsPb(Br_{1-b}I_b)_3$ and $0 \leq b < 0.5$.

Figure 2:
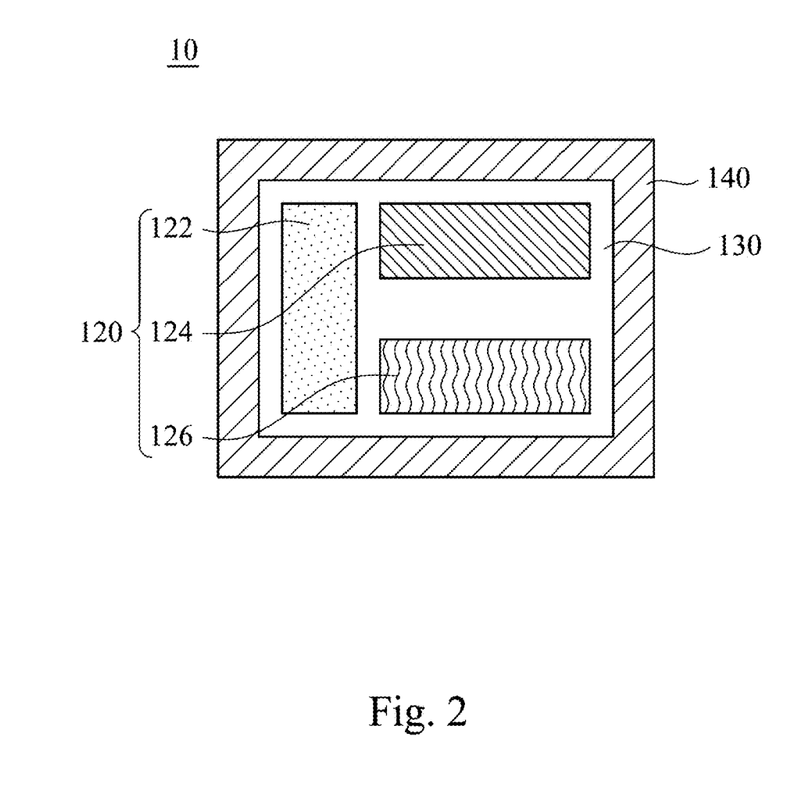
FIGS. 2, 3, 4, and 5 are top views of pixel array package structures according to various embodiments of the present disclosure.

The present disclosure utilizes these LED chips 122, 124, and 126 with different combinations to mix the three primary colors of light (red, green, and blue) to emit white light. For example, as shown in FIG. 1B, the pixel array package structure 10 includes a red LED chip 122, a green LED chip 124, and a blue LED wafer 126 arranged in a matrix with 3 columns and 1 row. In addition, the pixel array package structure 10 may also include a red LED chip 122, a green LED chip 124, and a blue LED chip 126 arranged as shown in FIG. 2.

Figure 3:
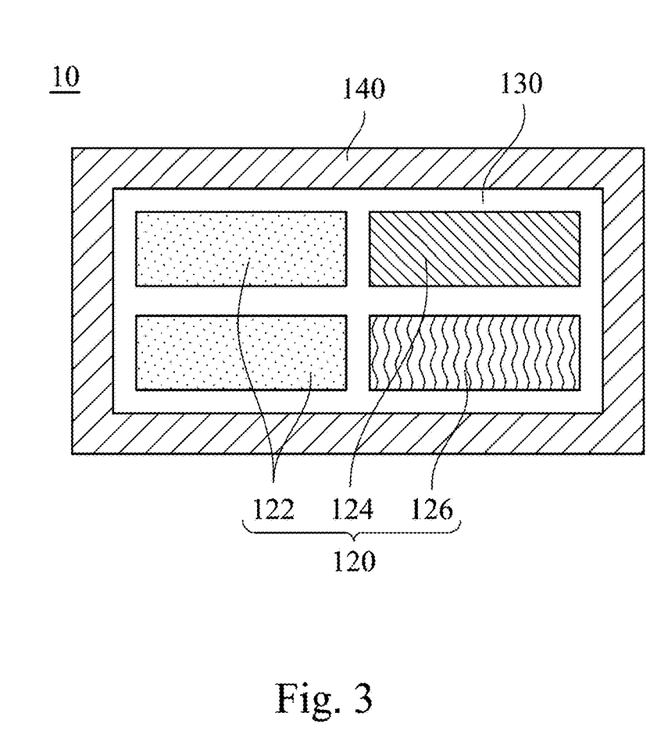

For another example, as shown in FIG. 3, the pixel array package structure 10 includes two red LED chips 122, a green LED chip 124, and a blue LED chip 126 arranged in a matrix with 2 columns and 2 rows. This design can increase color gamut (NTSC or BT. 2020 (Rec. 2020)) of the pixel array package structure 10. In an embodiment, the two red LED chips 122 may respectively have different wavelength bands for better red light color rendering effect. In another embodiment, the two red LED chips 122 may have the same wavelength band but have different brightness levels for better modulation in brightness.

Figure 4:
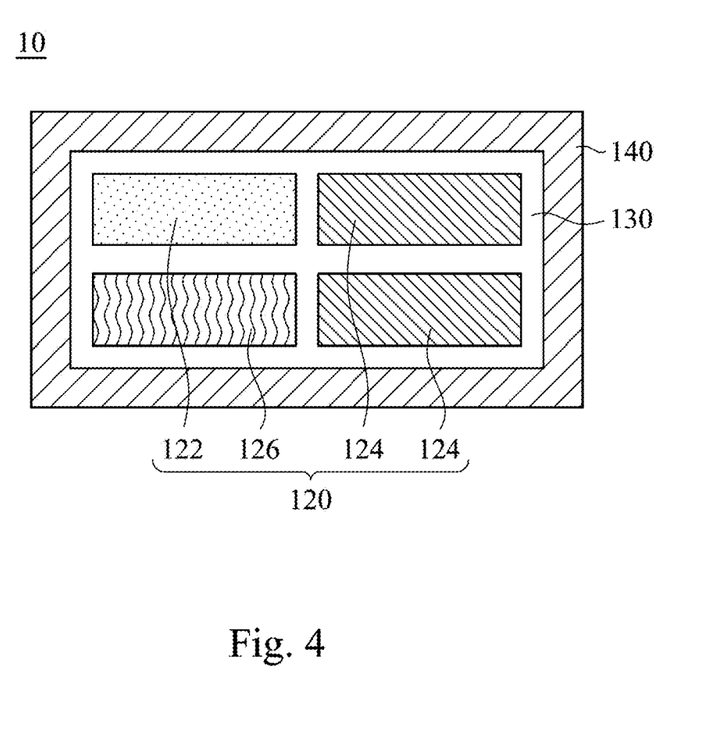

For another example, as shown in FIG. 4, the pixel array package structure 10 includes a red LED chip 122, two green LED chips 124, and a blue LED chip 126 arranged in a matrix with 2 columns and 2 rows. This design can increase the overall brightness of the pixel array package structure 10.

Figure 5:
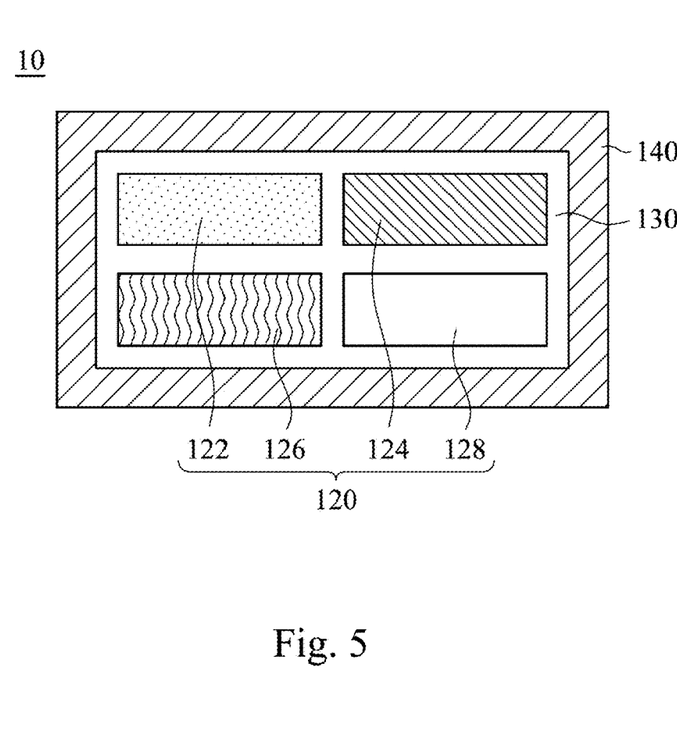

For example, as shown in FIG. 5, the pixel array package structure 10 includes a red LED chip 122, a green LED chip 124, a blue LED chip 126, and a white LED chip 128 arranged in a matrix with 2 columns and 2 rows. Since there is a white sub-pixel added in this design, display brightness can be improved when a backlight module with a same power is used. In other words, if a same brightness output is required, the power consumption of this design will be lower.

In general, if the LEDs of the LED chips 122, 124, and 126 have a grain size of about 100 μm to 300 μm (for example, 150 μm), those may be called as sub-millimeter LEDs (mini LEDs). If the LEDs of the LED chips 122, 124, and 126 have a grain size of less than 100 μm, those may be called as micro LEDs. In application, the sub-millimeter LEDs may be applied to products such as mobile phones, televisions, car panels, and esports notebooks, and the micro LEDs may be applied to fields of wearable watches, mobile phones, car displays, augmented reality/virtual reality, display screens and televisions.

Returning to FIG. 1C and FIG. 1D, the reflective layer 130 is disposed on the substrate 110 and between any two adjacent of the LED chips 122, 124, and 126. In general, the illumination angle of each of the LED chips 122, 124 or 126 is about 120 to 150 degrees. In order to prevent light emitted by the LED chips 122, 124 and 126 from interfering with each other or being absorbed, the reflective layer 130 of the present disclosure is disposed between any two adjacent of the LED chips. Such design can further enhance luminous efficiency of the pixel array package structure 10. In some embodiments, the reflective layer 130 is composed of a mixture of a colloidal material and inorganic particles. For example, the inorganic particles may include titanium dioxide ($TiO_2$), boron nitride (BN), silicon oxide ($SiO_2$), barium sulfate ($BaSO_4$) or aluminum oxide ($Al_2O_3$). The colloidal material may include polymethyl methacrylate (PMMA), polycarbonate (PC), allyl diglycol carbonate (CR-39), polystyrene (PS), epoxy (epoxy), polyamide, acrylate or silicone. In one embodiment, the inorganic particles have an average particle size (D50) less than 20 μm.

It should be noted that light reflectance of the reflective layer 130 depends on the concentration and characteristics of the inorganic particles in the colloidal material. The higher the concentration of the inorganic particles, the higher the light reflectance of the reflective layer 130. The higher the light reflectance of the inorganic particles themselves, the higher the light reflectance of the reflective layer 130. In some embodiments of the present disclosure, the light reflectance of the reflective layer 130 should be at least greater than light absorption thereof. In other words, the light energy of the light reflected by the reflective layer 130 should be higher than the light energy of the light absorbed by the reflective layer 130, so as to help improve the luminous efficiency of the pixel array package structure 10 and avoid rise of temperature of the reflective layer 130 due to absorption of the light energy, which will result in attenuation of the luminous efficiency of the pixel array package structure 10 due to the temperature effect. In addition, in some preferable embodiments, the light reflectance of the reflective layer 130 should be greater than about 90% to reflect the light emitted by the LED chip 122, 124 or 126 as much as possible, and to prevent the light from being absorbed by the reflective layer 130, which will reduce the luminous efficiency of the pixel array package structure 10.

As shown in FIGS. 1C and 1D, in some embodiments, the upper surface 130a of the reflective layer 130 is substantially coplanar with the upper surface of the pixel array 120. In various embodiments, the reflective layer 130 may be formed on the substrate 110 and filled between any two adjacent of the LED chips 122, 124 and 126 by molding, glue-filling or other suitable processes.

Referring to FIG. 1B, FIG. 1C, and FIG. 1D simultaneously, the light-absorbing layer 140 is disposed on the reflective layer 130 and surrounds the pixel array 120. In an embodiment, the lower surface 140b of the light-absorbing layer 140 is substantially coplanar with the upper surface 120a of the pixel array 120. In some embodiments, the light-absorbing layer 140 may cover a portion of the reflective layer 130 located on the periphery of the pixel array 120. In other embodiments, the light-absorbing layer 140 may also fully cover the reflective layer 130 located on the periphery of the pixel array 120. For example, the light-absorbing layer 140 is composed of a colloidal material and an inorganic material. For example, the colloidal material may include polymethyl methacrylate (PMMA), polycarbonate (PC), allyl diglycol carbonate (CR-39), polystyrene (PS), epoxy (epoxy), polyamide, acrylate or silicone. In addition, in some embodiments, the inorganic material may be carbon powder or perovskite or the like. In a plurality of examples, the carbon powder has a specific surface area of 50 $m^2$/g to 70 $m^2$/g, such as 52 $m^2$/g, 54 $m^2$/g, 56 $m^2$/g, 58 $m^2$/g, 60 $m^2$/g, 62 $m^2$/g, 64 $m^2$/g, 66 $m^2$/g or 68 $m^2$/g. In another example, the light-absorbing layer 140 may also be composed of a colloidal material and an organic material. For example, the organic material may include black pigment-added or dye-added polyimide resin, poly-vinyl alcohol resin, and/or acrylate resin. In various embodiments, the light-absorbing layer 140 may form a black frame surrounding the pixel array 120 by spin coating and lithography etching or by screen printing.

Referring to FIGS. 1C and 1D, the light-transmitting layer 150 is disposed on the pixel array 120, the reflective layer 130, and the light-absorbing layer 140. It should be noted that the light-transmitting layer 150 has an upper surface 150a and a lower surface 150b opposite thereto, in which the lower surface 150b is in contact with the pixel array 120, and the upper surface 150a has a roughness of 0.005 mm to 0.1 mm. In some examples, the light-transmitting layer 150 may include silicone or a resin. In various embodiments, the light-transmitting layer 150 may be formed by molding, glue-filling, or other suitable processes. In addition, a roughening process such as sand blasting or surface etching may be performed on the upper surface 150a of the light-transmitting layer 150. In various examples, the roughness of the upper surface 150a of the light-transmitting layer 150 may be 0.01 mm, 0.02 mm, 0.03 mm, 0.04 mm, 0.05 mm, 0.06 mm, 0.07 mm, 0.08 mm, or 0.09 mm. It is assumed that the upper surface 150a of the light-transmitting layer 150 is a smooth surface without being roughened, when the pixel array package structure 10 is illuminated by an external light source (e.g., sunlight, spot light or a light source), the viewer will not see the display screen and/or the glare problem is generated.

Continuously referring to FIG. 1C and FIG. 1D, in one embodiment, the pixel array package structure 10 further includes an anti-external light material 160 disposed on the light-transmitting layer 150. In some embodiments, the anti-external light material 160 may be a polarizer or an anti-reflective coating or the like. In one example, the anti-external light material 160 may be a circular polarizer.

In order to facilitate the comparison with the above embodiments and simplify the description, the same reference numerals are used to designate the same elements in the following embodiments, and the differences are mainly described for the respective embodiments, and repeated portions are not described.

Figure 6A:
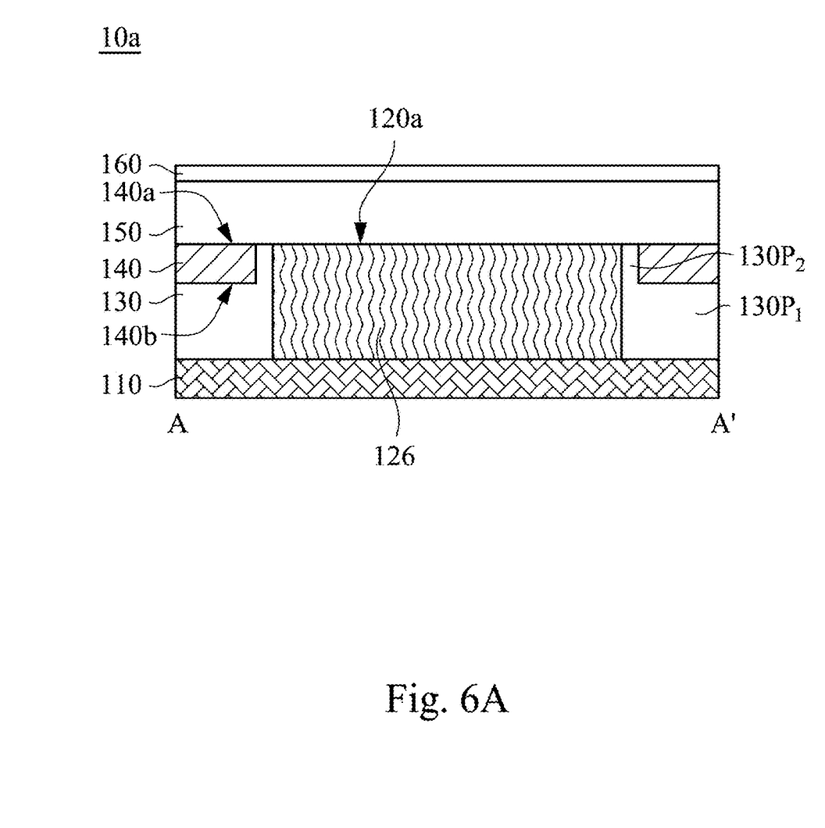
FIG. 6A and FIG. 6B are schematic cross-sectional views taken along line A-A' and line B-B' of FIG. 1B according to another embodiment of the present disclosure.
Figure 6B:
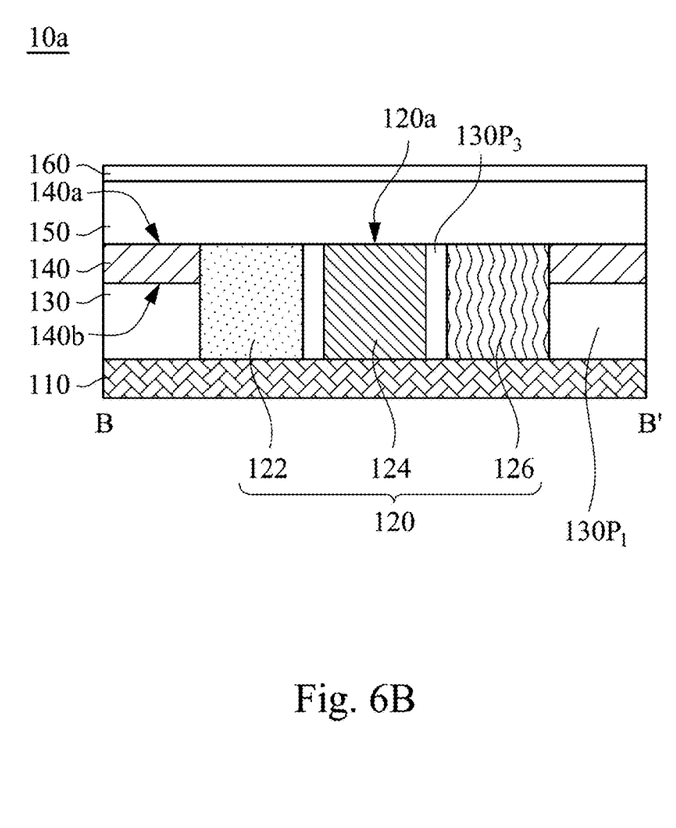

FIGS. 6A and 6B are cross-sectional views of a pixel array package structure 10a according to another embodiment of the present disclosure, in which FIG. 6A is a schematic cross-sectional view taken along line A-A' of FIG. 1B, and FIG. 6B a schematic cross-sectional view taken along line B-B' of FIG. 1B. As shown in FIGS. 6A and 6B, the difference between the pixel array package structure 10a illustrated in FIGS. 6A and 6B and the pixel array package structure 10 illustrated in FIGS. 1C and 1D is that the light-absorbing layer 140 of the pixel array package structure 10a is embedded in the reflective layer 130. In an embodiment, the upper surface 140a of the light-absorbing layer 140 is substantially coplanar with the upper surface 120a of the pixel array 120. Specifically, in the embodiment, the reflective layer 130 has a first portion $130P_1$, a second portion $130P_2$, and a third portion $130P_3$, in which the first portion $130P_1$ is located on the periphery of the pixel array 120 and interposed between the substrate 110 and the light-absorbing layer 140; the second portion $130P_2$ is an upward extension of the first portion $130P_1$, which surrounds the pixel array 120 and is interposed between the pixel array 120 and the light-absorbing layer 140; and the third portion $130P_3$ is located between any two adjacent of the LED chips 122, 124 and 126 of the pixel array 120. It should be noted that in other embodiments, the reflective layer 130 may not have the second portion $130P_2$, that is, the boundary of the light-absorbing layer 140 may be in close proximity to the periphery of the pixel array 120.

Figure 7A:
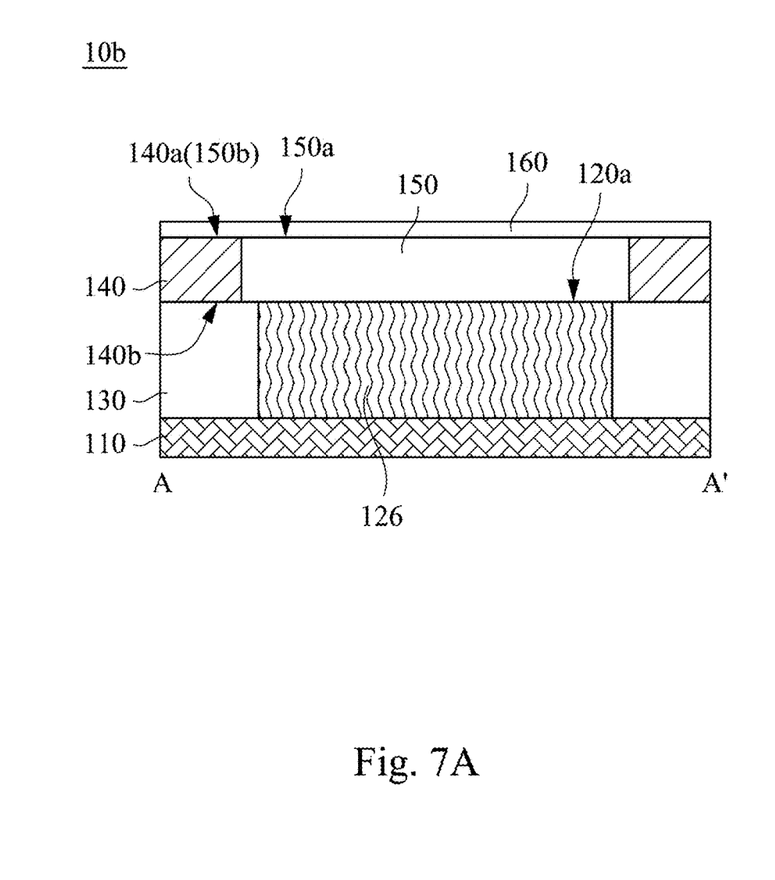
FIG. 7A and FIG. 7B are schematic cross-sectional views taken along line A-A' and line B-B' of FIG. 1B according to a further embodiment of the present disclosure.
Figure 7B:
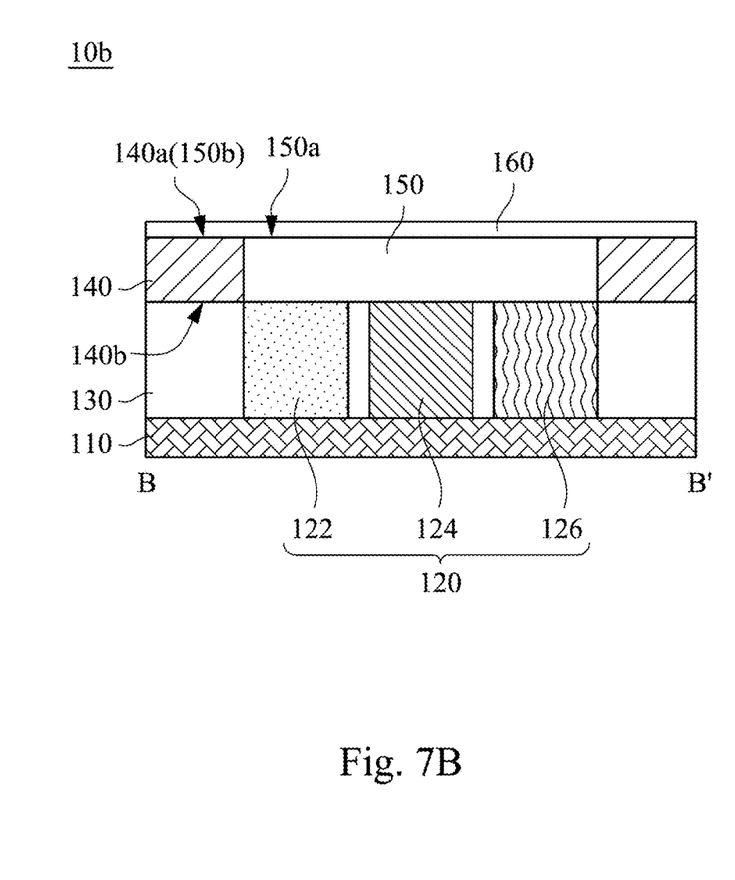

FIGS. 7A and 7B are cross-sectional views of a pixel array package structure 10b according to another embodiment of the present disclosure, in which FIG. 7A is a schematic cross-sectional view taken along line A-A' of FIG. 1B, and FIG. 7B is a schematic cross-sectional view taken along line B-B' of FIG. 1B. As shown in FIGS. 7A and 7B, the difference between the pixel array package structure 10b illustrated in FIGS. 7A and 7B and the pixel array package structure 10 illustrated in FIGS. 1C and 1D is that the upper surface 140a of the light-absorbing layer 140 of the pixel array package structure 10b is substantially coplanar with the upper surface 150a of the light-transmitting layer 150.

In an embodiment, the lower surface 140b of the light-absorbing layer 140 is substantially coplanar with the upper surface 120a of the pixel array 120. In an embodiment, the light-transmitting layer 150 may cover a portion of the reflective layer 130, that is, the light-absorbing layer 140 only covers a portion of the reflective layer 130 located at the periphery of the pixel array 120. In other embodiments, the light-absorbing layer 140 fully covers the reflective layer 130 located at the periphery of the pixel array 120.

Figure 8:
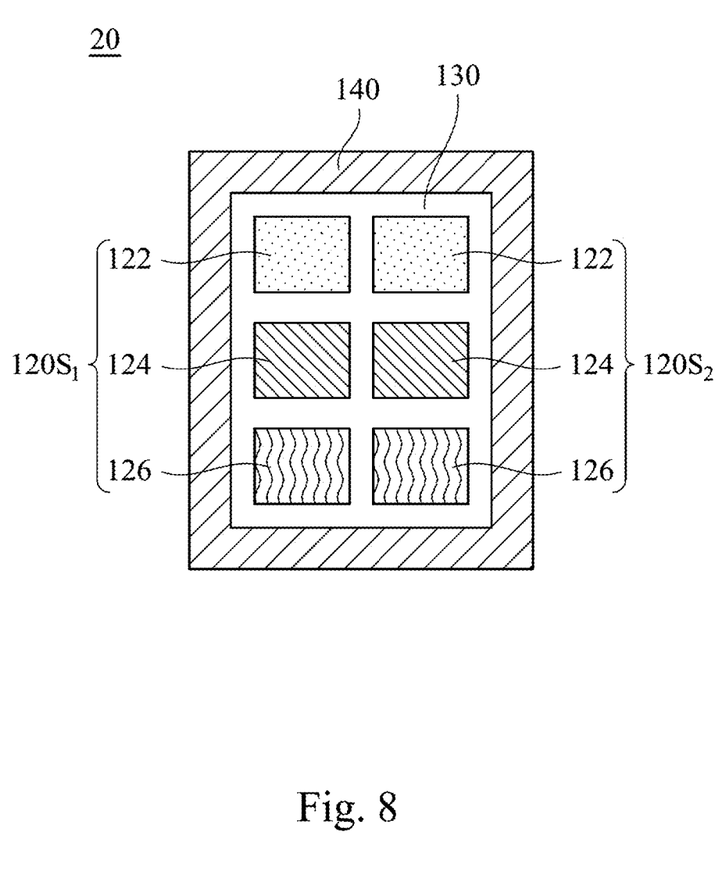
FIG. 8 is a top view of a pixel array package structure according to a variant embodiment of the present disclosure.

FIG. 8 is a top view of a pixel array package structure according to a variant embodiment of the present disclosure. As shown in FIG. 8, the difference between the pixel array package structure 20 illustrated in FIG. 8 and the pixel array package structure 10 illustrated in FIG. 1B is that the pixel array package structure 20 may include a first group pixel array $120S_1$ and a second group pixel array $120S_2$, in which each of the first group pixel array $120S_1$ and the second group pixel array $120S_2$ includes a red LED chip 122, a green LED chip 124 and a blue LED chip 126. The display application usually includes thousands or tens of thousands of pixel array package structures, and when one of a certain group LED chips of a certain pixel array package structure does not illuminate, another group LED chips will continue to operate by such design. It does not have a visual impact on the user and can reduce maintenance costs.

Figure 9A:
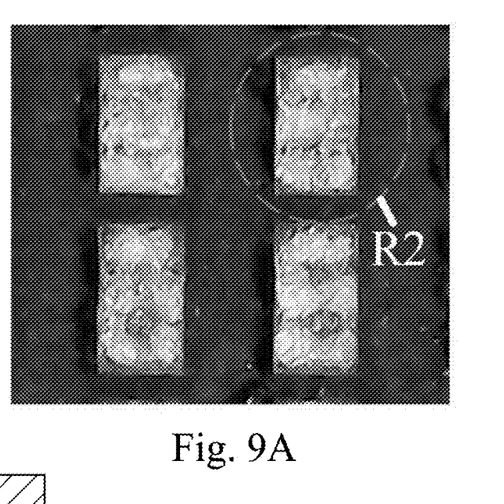
FIG. 9A is a microscopic top view of a pixel array package structure according to one embodiment of the present disclosure.
Figure 9B:
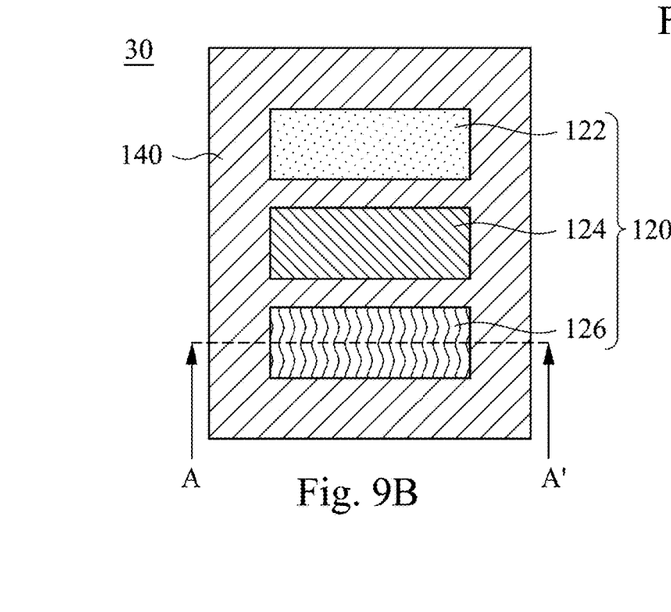
FIG. 9B is a partially enlarged view of a region R2 of FIG. 9A.
Figure 9C:
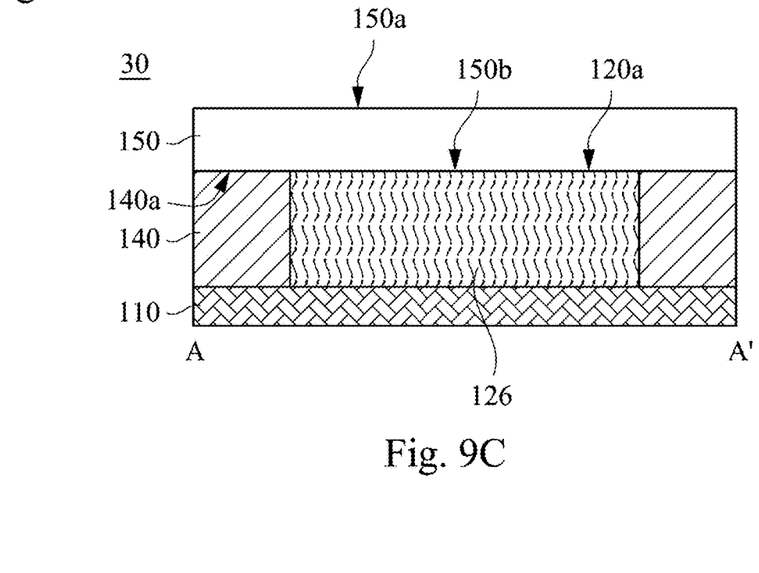
FIG. 9C is a schematic cross-sectional view taken along line A-A' of FIG. 9B.

FIG. 9A is a microscopic top view of a pixel array package structure 30 according to a variant embodiment of the present disclosure. FIG. 9B is a partially enlarged view of a region R2 of FIG. 9A. FIG. 9C is a schematic cross-sectional view taken along line A-A' of FIG. 9B. As shown in FIGS. 9B and 9C, the pixel array package structure 30 includes a substrate 110, a pixel array 120, a light-absorbing layer 140, and a light-transmitting layer 150. Specifically, the pixel array 120 is disposed on the substrate 110. The pixel array 120 includes a plurality of LED chips, such as at least one red LED chip 122, at least one green LED chip 124, at least one blue LED chip 126, and a combination thereof. The light-absorbing layer 140 is disposed on the substrate 110 and surrounds the pixel array 120. In the present embodiment, the upper surface of the light-absorbing layer 140 is substantially coplanar with the upper surface 120a of the pixel array 120. The light-transmitting layer 150 is disposed on the light-absorbing layer 140 and the pixel array 120. The light-transmitting layer 150 has an upper surface 150a and a lower surface 150b opposite thereto. The lower surface 150b of the light-transmitting layer 150 is in contact with the pixel array 120 and the light-absorbing layer 140, and the upper surface 150a thereof has a roughness of 0.005 mm to 0.1 mm. In one embodiment, the pixel array package structure 30 may further include an anti-external light material (not shown) disposed on the upper surface 150a of the light-transmitting layer 150.

Figure 10A:
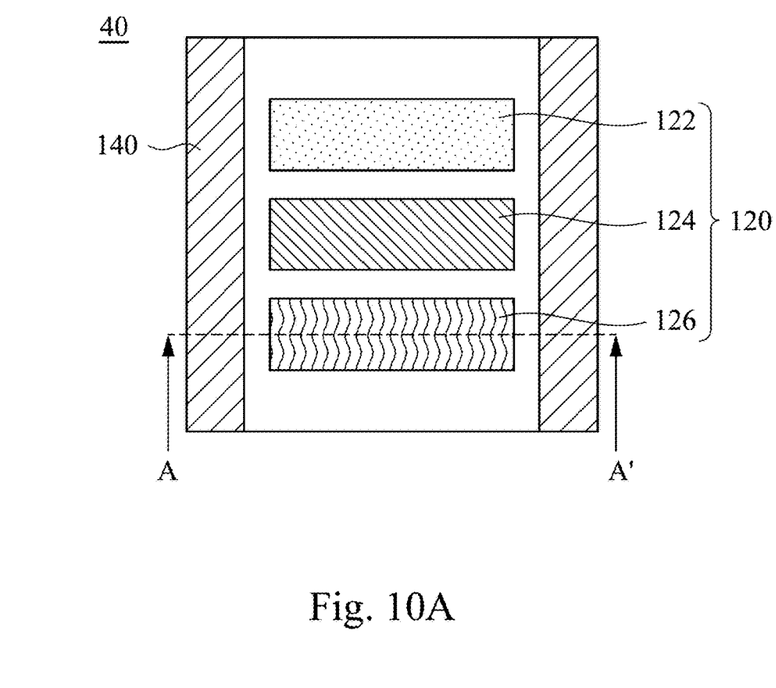
FIG. 10A is a top view of a pixel array package structure according to one embodiment of the present disclosure.
Figure 10B:
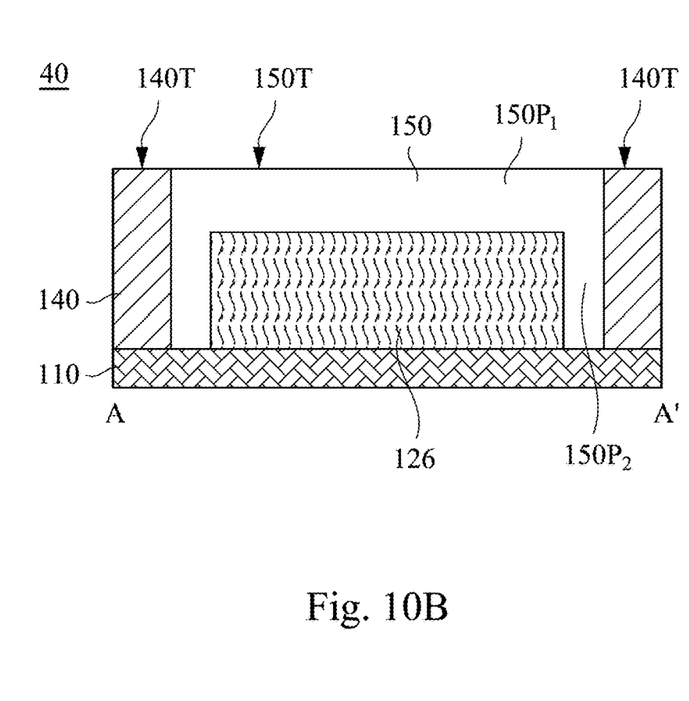
FIG. 10B is a schematic cross-sectional view taken along line A-A' of FIG. 10A.

FIG. 10A is a top view of a pixel array package structure 40 according to a variant embodiment of the present disclosure. FIG. 10B is a schematic cross-sectional view taken along line A-A' of FIG. 10A. As shown in FIGS. 10A and 10B, the pixel array package structure 40 includes a substrate 110, a pixel array 120, a light-absorbing layer 140, and a light-transmitting layer 150. Specifically, the pixel array 120 is disposed on the substrate 110. The pixel array 120 includes a plurality of LED chips, such as at least one red LED chip 122, at least one green LED chip 124, at least one blue LED chip 126, and a combination thereof. The light-absorbing layer 140 is disposed at both sides of the pixel array 120. The light-transmitting layer 150 is disposed between the light-absorbing layers 140 and surrounds the pixel array 120. In more detail, the light-transmitting layer 150 has a first portion $150P_1$ and a second portion $150P_2$, in which the first portion $150P_1$ is disposed on the pixel array 120, and the second portion $150P_2$ is disposed beneath the first portion $150P_1$ and interposed between the pixel array 120 and the light-absorbing layer 140. In the present embodiment, a top surface 150T of the light-transmitting layer 150 is substantially coplanar with the top surface 140T of the light-absorbing layer 140. In one embodiment, the pixel array package structure 40 further includes an anti-external light material (not shown) disposed on the top surface 150T of the light-transmitting layer 150 and the top surface 140T of the light-absorbing layer 140.

Figure 11:
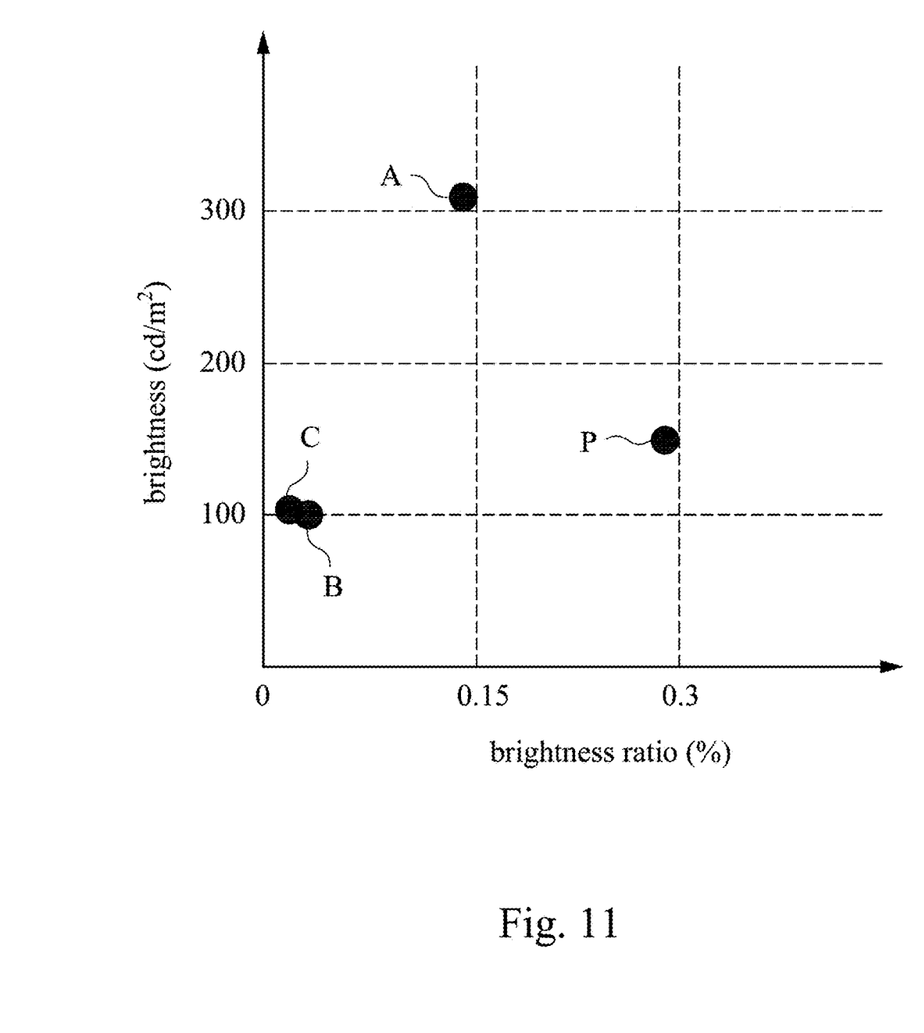
FIG. 11 is a graph comparing brightness of pixel array structures of the present disclosure with a conventional pixel array structure.

FIG. 11 is a graph comparing brightness of pixel array structures of the present disclosure with a conventional pixel array structure. As shown in FIG. 11, A represents a pixel array package structure 10, 10a or 10b of the present disclosure; B represents a pixel array package structure 30 of the present disclosure; C represents a pixel array package structure 40 of the present disclosure; and P represents a conventional pixel array structure. It should be noted that a light absorbing particles-added light-transmitting layer is used to encapsulate a pixel array of the conventional pixel array structure P. As shown in FIG. 11, the vertical axis represents brightness measured when a pixel array package structure is illuminated, and the horizontal axis represents a brightness ratio of an unilluminated pixel array package structure adjacent to the illuminated pixel array package structure to the illuminated pixel array package structure. That is, the greater the brightness of the vertical axis, the greater the luminous intensity of the pixel array package structure. The smaller the brightness ratio of the horizontal axis, the lower the effect on the unilluminated pixel array package structure from the illuminated pixel array package structure. The brightness ratio of the pixel array package structure of the present disclosure is preferably less than 0.15%. As can be seen from FIG. 11, the brightness of the conventional pixel array structure P is about 150 cd/m$^2$, and the brightness ratio thereof is about 0.267%. The brightness of the pixel array structure A of the present disclosure is about 310 cd/m$^2$, and the brightness ratio thereof is about 0.14%. The brightness of the pixel array structure B of the present disclosure is about 97 cd/m$^2$, and the brightness ratio thereof is about 0.036%. The brightness of the pixel array structure C of the present disclosure is about 105 cd/m$^2$, and the brightness ratio thereof is about 0.013%. Although the brightness ratio of the pixel array structures B and C of the present disclosure is much smaller than the brightness ratio of the pixel array structure A of the present disclosure, the brightness of the pixel array structures B and C is relatively low, and therefore, the pixel array structure A of the present disclosure is a preferable embodiment. In addition, compared the pixel array structure A with the conventional pixel array structure P, the brightness and brightness ratio of the pixel array structure A are better than those of the conventional pixel array structure P. Therefore, the pixel array structure A of the present disclosure not only can solve the problem of reduced light output of the forward light of the conventional pixel array structure P, but also can solve the problem of poor contrast.

Figure 12:
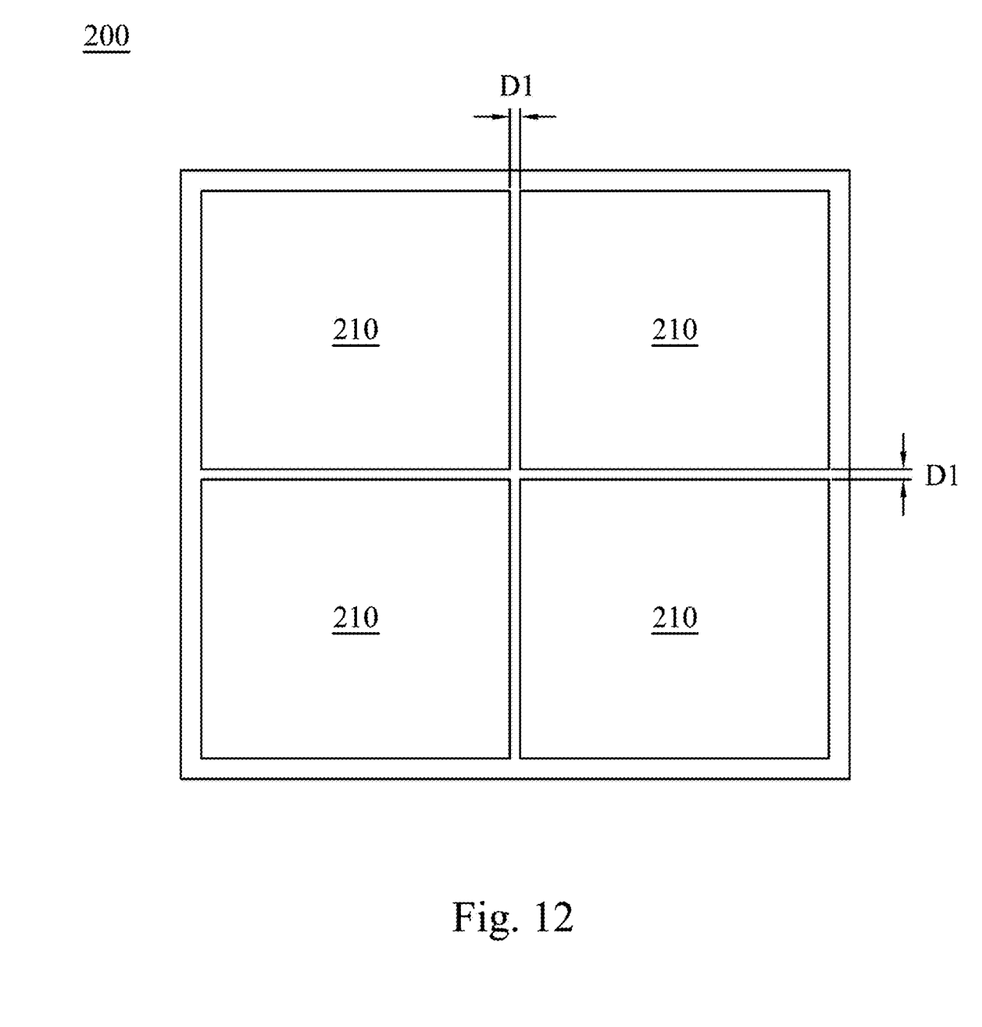
FIG. 12 is a top view of a display panel according to one embodiment of the present disclosure.
Figure 13:
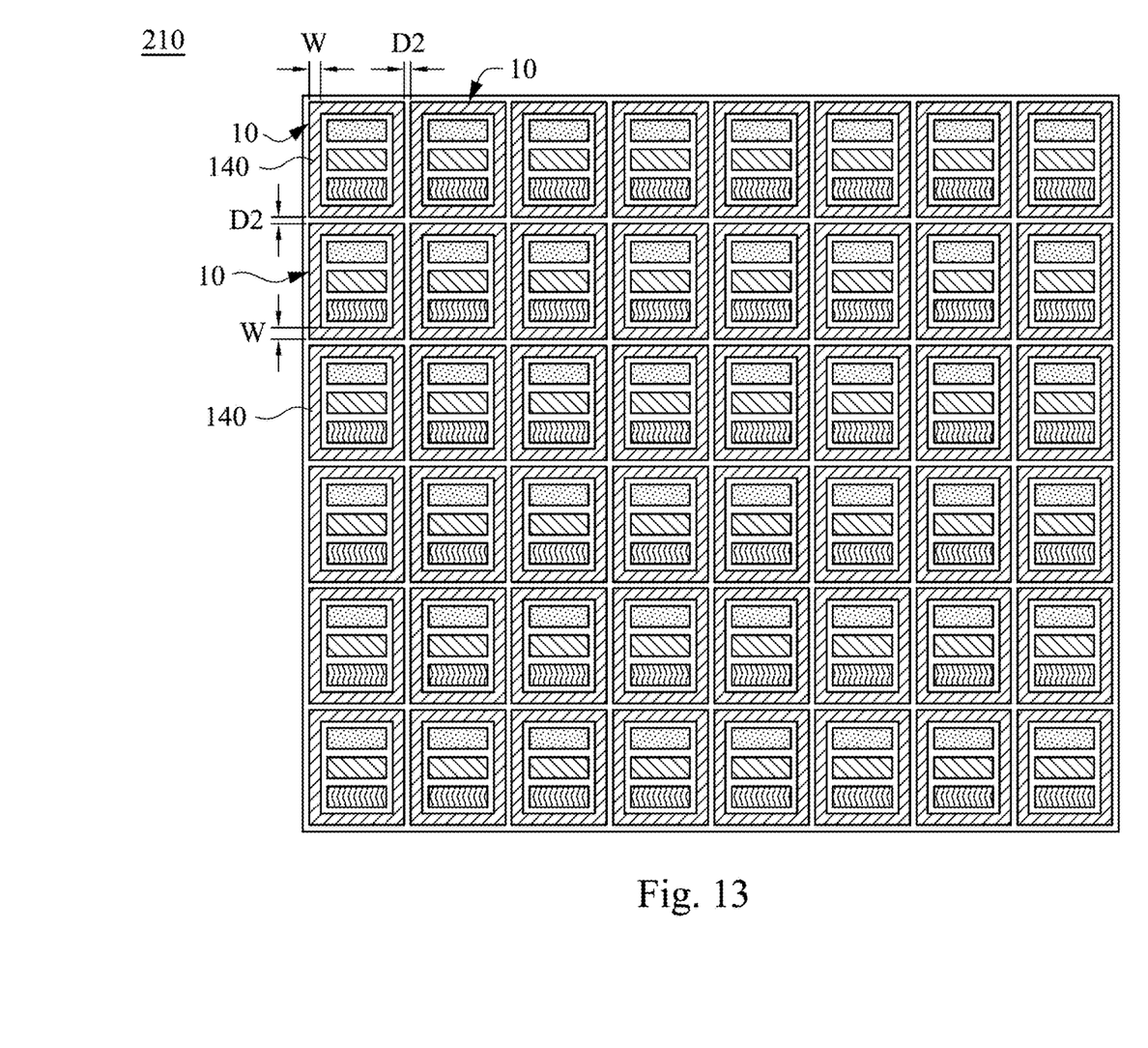
FIG. 13 is a partially enlarged view of FIG. 12.

FIG. 12 is a top view of a display panel 200 according to one embodiment of the present disclosure. FIG. 13 is a partially enlarged view of FIG. 12. Referring to FIG. 12 first, the display panel 200 includes a plurality of sub-display panels 210. Specifically, any two adjacent of the sub-display panels 210 have a splicing gap D1 therebetween. In various embodiments, the splicing gap D1 between the sub-display panels 210 is less than 100 μm. For the viewer, the presence of these splicing gaps D1 may cause the display screen to be cut and visually discontinuous.

Referring to FIG. 13, each of the sub-display panels 210 includes a plurality of pixel array package structures 10 as described above. In more detail, in various embodiments, any two adjacent of the pixel array package structures 10 have a pitch D2 therebetween. When the LED chips in the pixel array package structure 10 are designed as micro LEDs, the pitch D2 between the pixel array package structures 10 is less than about 0.5 mm. When the pixel array package structures 10 are designed as mini LEDs, the pitch D2 between the pixel array package structures 10 is about 0.5 mm to 1.0 mm. In the embodiment of the mini LEDs, the width W of the light-absorbing layer 140 in the pixel array package structure 10 is in a range of 50 μm to 650 μm, such as 100 μm, 150 μm, 200 μm, 250 μm, 300 μm, 350 μm, 400 μm, 450 μm, 500 μm, 550 μm, or 600 μm. A single sub-display panel 210 may include tens of thousands to hundreds of thousands of the pixel array package structures 10, and any two adjacent of the pixel array package structures 10 have a sub-splicing gap (2W+D2). In the case where the single sub-display panel 210 has been divided by a plurality of sub-splicing gaps (2W+D2), the splicing gaps D1 between these sub-display panels 210 (indicated in FIG. 12) is not obvious to the viewer.

In other embodiments, each of the sub-display panels 210 may also include a plurality of the pixel array package structures 10a, 10b, 20, 30 or 40 as described above.

In summary, the various embodiments provided by the present disclosure can increase the brightness of the LED chips without losing the contrast. Since the position of lateral light output of the LED chip is encapsulated by an opaque material or a highly reflective material, and the position of forward light output of the LED chip is encapsulated by a high transmittance material, the problem of low light efficiency resulting from absorption of the light emitted by the LED by the light-absorbing particles in the prior art can be improved. In addition, the sub-splicing gaps in the single sub-display panel constituted by the light-absorbing layer and the pitch of any two adjacent of the pixel array package structures can make the viewer feel seamlessly splicing visual effects of the display panel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel array package structure, comprising:
a substrate;
a pixel array disposed on the substrate, wherein the pixel array comprises a plurality of light emitting diode chips, and the plurality of light emitting diode chips comprise at least one red diode chip, at least one green diode chip, at least one blue diode chip, and a combination thereof;
a reflective layer disposed on the substrate and between any two adjacent of the plurality of light emitting diode chips;
a light-absorbing layer disposed on the reflective layer and surrounding the pixel array; and
a light-transmitting layer directly disposed on the pixel array, the reflective layer, and the light-absorbing layer, wherein the light-transmitting layer has an upper surface and a lower surface opposite thereto, and the lower surface is in contact with the pixel array, and the upper surface has a roughness of 0.005 mm to 0.1 mm, wherein an upper surface of the light-transmitting layer is higher than an upper surface of the light-absorbing layer, and a first material of the light-transmitting layer directly disposed on the pixel array is the same as a second material of the light-transmitting layer directly disposed on the light-absorbing layer.

2. The pixel array package structure of claim 1, further comprising an anti-external light material disposed on the light-transmitting layer.

3. The pixel array package structure of claim 2, wherein the anti-external light material is a polarizer.

4. The pixel array package structure of claim 1, wherein the reflective layer is composed of a mixture of a colloidal material and inorganic particles, wherein the inorganic particles comprise titanium dioxide, boron nitride, silicon dioxide, barium sulfate or aluminum oxide.

5. The pixel array package structure of claim 1, wherein a lower surface of the light-absorbing layer is substantially coplanar with an upper surface of the pixel array.

6. The pixel array package structure of claim 1, wherein an upper surface of the light-absorbing layer is substantially coplanar with an upper surface of the pixel array.

7. The pixel array package structure of claim 1, wherein the light-absorbing layer is composed of a colloidal material and an inorganic material, or a colloidal material and an organic material.

8. The pixel array package structure of claim 7, wherein the inorganic material is carbon powder or perovskite.

9. The pixel array package structure of claim 8, wherein the carbon powder has a specific surface area of 50 $m^2$/g to 70 $m^2$/g.

10. A display panel, comprising:
a plurality of sub-display panels, any two adjacent of the sub-display panels having a splicing gap, wherein each of the sub-display panels comprises a plurality of the pixel array package structures of claim 1.

* * * * *